US012700442B2

(12) United States Patent
Shah et al.

(10) Patent No.: US 12,700,442 B2
(45) Date of Patent: Aug. 4, 2026

(54) METHOD, DEVICE, AND CIRCUIT FOR HIGH-SPEED MEMORIES

(71) Applicant: Taiwan Semiconductor Manufacturing Company, Ltd., Hsinchu (TW)

(72) Inventors: Jaspal Singh Shah, Hsinchu (TW); Atul Katoch, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 85 days.

(21) Appl. No.: 18/659,412

(22) Filed: May 9, 2024

(65) Prior Publication Data

US 2025/0349333 A1 Nov. 13, 2025

(51) Int. Cl.
*G11C 8/18* (2006.01)
*G06F 1/08* (2006.01)

(52) U.S. Cl.
CPC . *G11C 8/18* (2013.01); *G06F 1/08* (2013.01)

(58) Field of Classification Search
CPC ................................... G11C 8/18; G06F 1/08
See application file for complete search history.

(56) References Cited

U.S. PATENT DOCUMENTS

| | | | | |
|---|---|---|---|---|
| 5,088,062 A * | 2/1992 | Shikata | ................. | G11C 7/1078 |
| | | | | 365/189.04 |
| 6,201,410 B1 * | 3/2001 | New | .................. | H03K 19/1737 |
| | | | | 326/38 |

| | | | |
|---|---|---|---|
| 7,171,323 B2 | 1/2007 | Shipton et al. | |
| 8,169,851 B2 | 5/2012 | Chou | |
| 9,837,142 B1 | 12/2017 | Chan et al. | |
| 2015/0325287 A1 | 11/2015 | Tao et al. | |
| 2018/0328988 A1 | 11/2018 | Mcwilliams | |
| 2023/0238073 A1 | 7/2023 | Shah et al. | |
| 2024/0153573 A1 * | 5/2024 | Shah ............... | G11C 29/12015 |

FOREIGN PATENT DOCUMENTS

TW 202349195 A 12/2023

OTHER PUBLICATIONS

Office Action issued in Taiwan Appl. No. 113139420 dated May 14, 2025.
Office Action issued in Korean Appl. No. 10-2025-0058349 dated Oct. 15, 2025.

* cited by examiner

*Primary Examiner* — Jay W. Radke
(74) *Attorney, Agent, or Firm* — Foley & Lardner LLP

(57) ABSTRACT

A memory device includes a plurality of memory cells arranged in an array, a first clock generator connected to the plurality of memory cells and configured to generate a local clock signal to be provided to the plurality of memory cells, a second clock generator connected to an input/output interface connected to the plurality of memory cells, the second clock generator configured to generate a global clock signal to be provided to the input/output interface, and one or more logic gates connected to at least one of the first clock generator or the second clock generator, wherein the one or more logic gates allow the local clock signal and the global clock signal to be output independently.

20 Claims, 3 Drawing Sheets

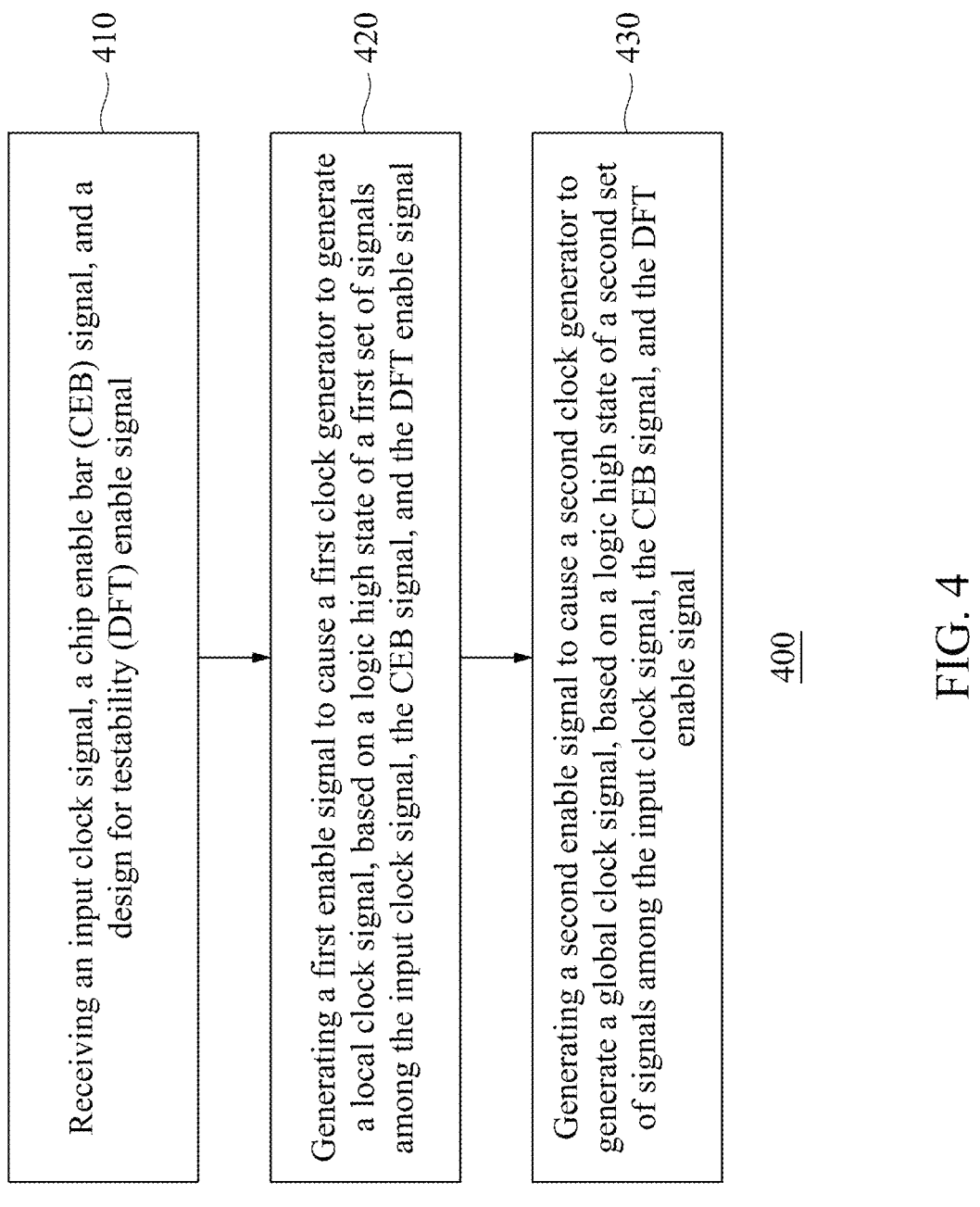

Receiving an input clock signal, a chip enable bar (CEB) signal, and a design for testability (DFT) enable signal — 410

Generating a first enable signal to cause a first clock generator to generate a local clock signal, based on a logic high state of a first set of signals among the input clock signal, the CEB signal, and the DFT enable signal — 420

Generating a second enable signal to cause a second clock generator to generate a global clock signal, based on a logic high state of a second set of signals among the input clock signal, the CEB signal, and the DFT enable signal — 430

METHOD, DEVICE, AND CIRCUIT FOR HIGH-SPEED MEMORIES

BACKGROUND

Today's system-on-a-chip (SOC) designs can contain large numbers of memories. These memories may occupy most of the portion of SOCs and any failure in memory may affect the SOC operation. Therefore, a Design for Testability (DFT) approach testing may be used to screen out damaged chips. DFT can be implemented as a segment of a circuit on a chip, board, or system that is utilized to test the circuit itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a flowchart of a method to operate a memory system, in accordance with some embodiments.

DETAILED DESCRIPTION

Figure 1:
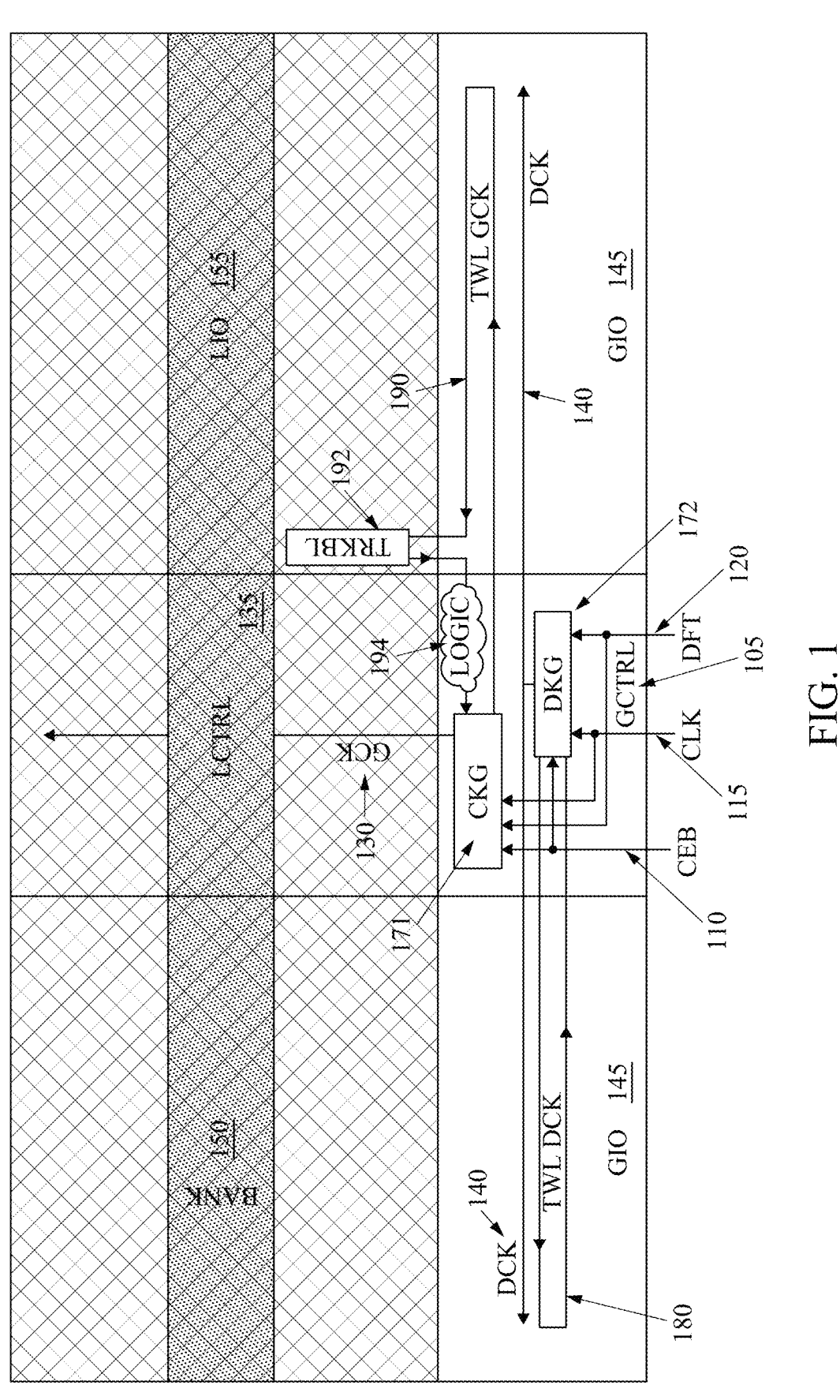
FIG. 1 illustrates a schematic diagram of a memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As digital circuits become increasingly complex, testing techniques may not provide coverage to detect potential faults or defects of the circuit efficiently and effectively.

Furthermore, there is an increasing need for identifying and fixing issues early in the design and manufacturing process to reduce the overall costs of the circuit products. To facilitate testing of memory circuits, DFT features can be incorporated directly into a digital circuit and detect faults in the circuit. For example, DFT can be implemented as a segment of the circuit on a chip, board, or system that is utilized to test the circuit itself. The circuit in DFT mode can include signals, such as DFT enable signals, which activate testing features when needed. According to such a signal, the circuit, including the DFT features, can test itself and provide test responses, allowing for analysis of its behavior and identification of faults. The circuit can include or be operably connected to a control circuit, which can manage the activation of DFT mode (e.g., control timing of testing features by providing an enable signal).

In the existing memory devices that do not implement the disclosed memory circuit, a memory device typically uses an external or an SOC clock to generate an internal clock to perform memory operations and DFT operations. As such the internal clock, including a global clock signal and a local clock signal, are generated by a common clock generator. However, such an approach has a notable downside, for example, a significant timing penalty, as mission mode paths need to be disabled when a DFT operation is enabled. For example, read and/or write signals need to be disabled during a DFT operation, which increases an overall setup and hold time, thereby limiting a speed of the DFT operation and the device.

The present disclosure provides various embodiments of a memory circuit, method, and device for independently generating internal clock signals. In some embodiments, a memory device can include a first clock generator configured to provide a local clock signal and a second clock generator configured to provide a global clock signal. The memory device can include one or more logic gates to allow the local clock signal and the global clock signal to be output independently. This allows for a DFT mode clock generation to be independent of a mission mode clock generation, thereby enabling an independent tuning of power, performance, and area (PPA) for the DFT operation. Likewise, the PPA for the mission mode can be tuned without affecting the DFT operation. This provides a simple and flexible solution to improve the DFT mode frequency of operation in an efficient way in various memory applications (e.g., an SRAM macro).

FIG. 1 illustrates a schematic diagram of a memory system 100, in accordance with some embodiments. The memory system 100 may be referred to as a memory device. The memory system 100 includes a global control circuit (GCTRL) 105. In some embodiments, the GCTRL 105 can independently generate internal clock signals (e.g., a mission mode clock signal and a DFT mode clock signal). Mission mode operation can also be referred to as normal operation. The GCTRL 105 may be referred to as a control circuit.

The GCTRL 105 can include a number of inputs. The GCTRL 105 receives a chip enable bar (CEB) signal via a CEB line 110. The CEB signal can be configured to activate and/or enable at least one component of the GCTRL 105. The GCTRL 105 receives a clock (CLK) signal via a CLK line 115. The CLK signal can be configured to enable a generation of a clock signal by the GCTRL 105. The GCTRL 105 receives a DFT enable signal via a DFT line 120. The DFT enable signal can be configured to enable a generation of a signal indicating an operation of DFT mode.

In some embodiments, the DFT enable signal can include a DFT bypass signal and/or a scan enable (SE) signal.

The memory system 100 includes a memory bank 150. The memory bank 150 can include a number of memory cells. The memory cells can operate in accordance with word line, bit line, select line, and read/write related signals. Although only one memory bank 150 is shown, the memory system 100 can include two or more memory banks 150 without departing from the scope of the present disclosure.

The GCTRL 105 includes a number of outputs. The GCTRL 105 provides a local clock (GCK) signal via a GCK line 130 that couples the GCTRL 105 to a local control circuit (LCTRL) 135. In some embodiments, the GCK signal may be referred to as the GCK pulse (GCKP). In some embodiments, GCK is enabled during mission mode (e.g., for accessing the memory bank 150, performing read/write operation, etc.). In some embodiments, the LCTRL 135 can receive the GCK signal via the GCK line 130. In some embodiments, the outputs data signal from the memory bank 150. Although only one LIO 155 is shown, the LIO 155 memory system 100 can include two or more LIO 155 without departing from the scope of the present disclosure. In some embodiments including two or more LIO 155, each LIO 155 can perform IO operations for a corresponding memory bank 150. In some embodiments, at least one of the memory bank 150 or the LIO 155 receives the GCK signal via the GCK line 130.

The GCTRL 105 provides a DFT-or-mission mode clock (DCK) signal via a DCK line 140. In some embodiments, the DCK signal is referred to as a global clock signal. The DCK signal is enabled during DFT mode (e.g., for testing the memory system 100, etc.) and/or during mission mode. In some embodiments, the DCK signal can be enabled without disabling GCK and GCK dependent signals such as word line, bit line, select line, and read/write related signals. The DCK signal and the GCK and GCK dependent signals can be independently provided, as discussed in greater detail below. The memory system 100 includes a global input/output interface (GIO) 145. The GIO 145 receives the DCK signal via the DCK line 140. In some embodiments, the DCK signal can include a signal to enable a test mode operation of the circuit.

Figures 2, 3:
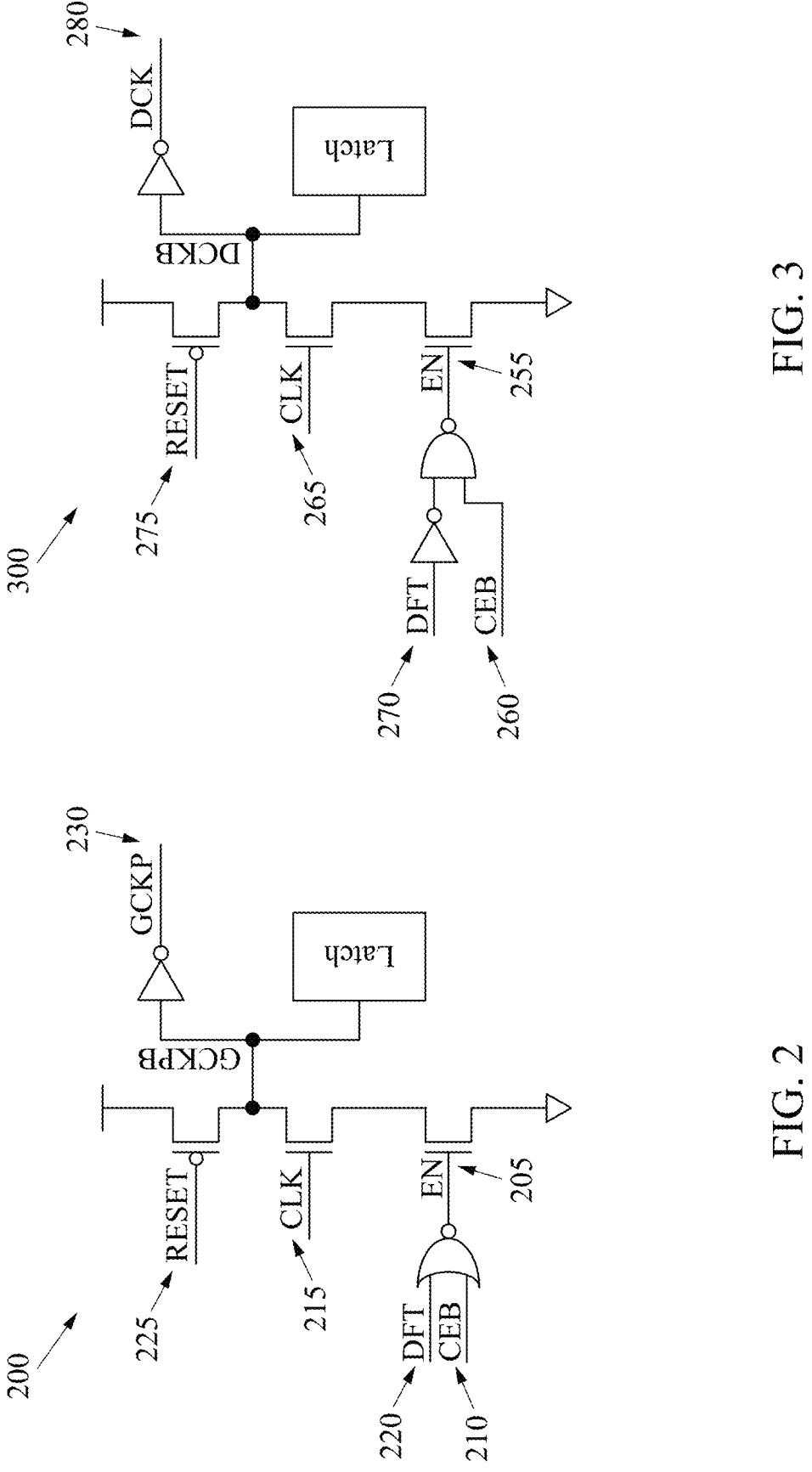
FIG. 2 illustrates a schematic diagram of a circuit in the memory system shown in FIG. 1, in accordance with some embodiments.
FIG. 3 illustrates a schematic diagram of a circuit in the memory system shown in FIG. 1, in accordance with some embodiments.

The GCTRL 105 can be configured to provide the GCK signal and the DCK signal independently. In some embodiments, the GCTRL 105 can include a first clock generator (CKG) 171 to provide the GCK signal via the GCK line 130. The CKG 171 can generate the GCK signal according to the CEB signal, the CLK signal, and the DFT enable signal. In some embodiments, the GCTRL 105 can include a second clock generator (DKG) 172 to provide the DCK signal via the DCK line 140. The DKG 172 can generate the DCK signal according to the CEB signal, the CLK signal, and the DFT enable signal. In some embodiments, the GCTRL 105 can include one or more logic gates or circuits to independently generate the GCK signal and/or the DCK signal according to the CLK signal, the CEB signal, and the DFT enable signal. The one or more logic gates or circuits can be connected to at least one of the CKG 171 or the DKG 172 such that the CKG 171 and the DKG 172 can provide a respective clock signal (e.g., the GCK signal and the DCK signal, respectively) independently. For example, the CKG 171 and/or the DKG 172 can include or be connected to one or more logic gates or circuits, as shown in FIG. 2 and FIG. 3.

In some embodiments, the memory system 100 can include tracking bit (TRKBL) cells 192, each of which is connected to a TWL GCK line 190. In some embodiments, a tracking word line of the TRKBL cells 192 can include a (e.g., horizontal) portion extending along the rows of the memory bank 150 (not expressly shown), and a (e.g., vertical) portion extending along the columns of the memory bank 150 (not expressly shown). The TRKBL cells 192 can conduct a local tracking word line (TWL_GCK) signal that can be provided by the TWL_GCK line 190. By conducting the TWL_GCK signal, the TRKBL cells 192 can emulate signal routing delays in a functional memory array (e.g., the memory bank 150).

In general, the TRKBL cells 192 do not function as the (nominal) memory bank 150 do in terms of storing data and supporting read/write operations. Rather, the TRKBL cells 192 can originally be a subset of the memory bank 150 but be enlisted, or re-purposed, for timing tracking. For example, the TRKBL cells 192 can be or include bit cells with fixed logic values configured and coupled to one another to respond in a predictable way when addressed by test or tracking signals. For example, when the TWL_GCK signal transitions to a high logic state, each of the TRKBL cells 192 can be turned on, and pre-charged tracking bit lines can start being discharged to a low logic state. In response to being discharged, the TWL_GCK signal can transition from a high logic state to a low logic state. When the TWL_GCK signal transitions to a low enough voltage (e.g., dropped by a predefined $\Delta V$), at least one other signal, for example, the GCK signal, can be configured to be reset.

In some embodiments, the CKG 171 can generate the TWL_GCK signal that can be provided via the TWL_GCK line 190 and traverse through the GIO 145. The TWL_GCK signal can discharge a bit line of the TRKBL cells 192. In some embodiments, a discharged bit line can generate a reset signal to reset the GCK signal based on one or more logic gates or circuits 194. In some embodiments, a reset of the GCK signal can be triggered in response to a GCK bar (GCKPB) signal being in a low logic state. For example, the GCK signal can be reset as soon as the GCKPB signal becomes low. In some embodiments, such a reset signal can determine a pulse width of the GCK signal for a read or write operation.

In some embodiments, the DKG 172 can generate a global tracking word line (TWL_DCK) signal that can be provided via a TWL_DCK line 180 and traverse through the GIO 145. The TWL_DCK signal can be used to access the GIO 145. In some embodiments, after accessing the GIO 145, the TWL_DCK signal can be used to generate a reset signal to reset the DCK signal. In some embodiments, such a reset signal can determine a pulse width of the DCK signal.

FIG. 2 illustrates a schematic diagram of a circuit 200 in the memory system 100 shown in FIG. 1, in accordance with some embodiments. More specifically, the circuit 200 may be or be part of the CKG 171. As shown in FIG. 2, the circuit 200 can include one or more logic gates or circuits to output a GCK signal (or GCKP) 230 according to input signals (e.g., a CEB signal 210, a CLK signal 215, a DFT enable signal 220, etc.). In some embodiments, the one or more logic gates can perform a logic NOR operation on the DFT enable signal 220 and the CEB signal 210 to generate an enable signal EN 205, which enables a generation of the GCK signal 230.

Table 1 shows an exemplary combination of signals that can enable the GCK signal 230. In some embodiments, a "1" indicates to enable and a "0" indicates to disable.

TABLE 1

| CLK | CEB | DFT | EN | GCK |
|-----|-----|-----|----|-----|
| 1 | 0 | 0 | 1 | 1 |
| 1 | 0 | 1 | 0 | 0 |
| 1 | 1 | 0 | 0 | 0 |
| 1 | 1 | 1 | 0 | 0 |

In some embodiments, in response to the EN signal 205 (e.g., the "NOR" operation of the CEB signal 210 and the DFT enable signal 220) being in a first logic state (e.g., "1"), the memory system 100 can perform a mission mode operation, and the GCK signal 230 generated by the GCTRL 105 (e.g., the CKG 171) can be provided.

In some embodiments, the GCK signal 230 can include a TWL_GCK signal. The TWL_GCK signal can discharge a bit line of TRKBL cells. In some embodiments, a discharged bit line can generate a reset signal RESET 225 to reset a generation of the GCK signal 230. In some embodiments, a reset of the GCK signal 230 can be triggered in response to a GCK bar (GCKPB) signal being in a low logic state. For example, a generation of the GCK signal 230 can be reset as soon as the GCKPB signal becomes low. In some embodiments, the reset signal RESET 225 can determine a pulse width of the GCK signal 230.

FIG. 3 illustrates a schematic diagram of a circuit 300 in the memory system 100 shown in FIG. 1, in accordance with some embodiments. More specifically, the circuit 300 may be or be part of the DKG 172. As shown in FIG. 3, the circuit 300 can include one or more logic gates to output a DCK signal 280 according to input signals (e.g., a CEB signal 260, a CLK signal 265, a DFT enable signal 270, etc.). In some embodiments, the one or more logic gates can perform a logic NOT operation on the DFT enable signal 270 and a logic NAND operation on a result of the logic NOT operation and the CEB signal 260 to generate an enable signal EN 255, which enables a generation of the DCK signal 280.

Table 2 shows an exemplary combination of signals that can enable the DCK signal. In some embodiments, a "1" indicates to enable and a "0" indicates to disable.

TABLE 2

| CLK | CEB | DFT | EN | DCK |
|-----|-----|-----|----|-----|
| 1 | 0 | 0 | 1 | 1 |
| 1 | 0 | 1 | 1 | 1 |
| 1 | 1 | 0 | 0 | 0 |
| 1 | 1 | 1 | 1 | 1 |

In some embodiments, in response to the EN signal 255 (e.g., the "NAND" operation of a CEB signal 260 and a result of the "NOT" operation of a DFT enable signal 270) being in a first logic state (e.g., "1"), the memory system 100 can perform a DFT mode operation, and the DCK signal 280 generated by the GCTRL 105 (e.g., the DKG 172) can be provided. This allows for a clock generation in DFT mode independent of a clock generation in mission mode.

In some embodiments, the DCK signal 280 can include a TWL_DCK signal. The TWL_DCK signal can be used to access a GIO interface. In some embodiments, after accessing the GIO interface, the TWL_DCK signal can be used to generate a reset signal RESET 275 to reset the DCK signal 280. In some embodiments, the reset signal RESET 275 can determine a pulse width of the DCK signal 280.

Referring to Table 1 and Table 2, the memory system 100 can be configured to provide a local signal (e.g., GCK) and a global signal (e.g., DCK) independently. In some embodiments, the GCTRL 105 (e.g., one or more logic gates therein) can be configured to cause, in a first state (e.g., CEB being in a second logic state, such as logic low or "0" and DFT being in a second logic state, such as logic low or "0"), the first clock generator 171 and the second clock generator 172 to generate the GCK signal and the DCK signal, respectively. For example, as shown, an enable signal EN of a high logic state (e.g., "1") for each of the GCK signal and the DCK signal can be generated. The GCTRL 105 can be configured to cause, in a second state (e.g., CEB being in the second logic state, such as logic low or "0" and DFT being in a first logic state, such as logic high or "1"), the second clock generator 172 to generate the DCK signal. In this case, the first clock generator 171 can be prevented from generating the GCK signal. For example, as shown, an enable signal EN of a high logic state (e.g., "1") only for the DCK signal can be generated. The GCTRL 105 can be configured to prevent, in a third state (e.g., CEB being in a first logic state, such as logic high or "1" and DFT being in the second logic state, such as logic low or "0"), the first clock generator 171 and the second clock generator 172 from generating the GCK signal and the DCK signal, respectively. For example, an enable signal EN is not generated or remains in a logic low state (e.g., "0") for both of the GCK signal and the DCK signal. The GCTRL 105 can be configured to cause, in a fourth state (e.g., CEB being in the first logic state, such as logic high or "1" and DFT being in the first logic state, such as logic high or "1"), the second clock generator 172 to generate the DCK signal. In this case, the first clock generator 171 can be prevented from generating the GCK signal. For example, as shown, an enable signal EN of a high logic state (e.g., "1") only for the DCK signal can be generated.

In some embodiments, at least one of the DFT enable signal (e.g., DFT in Table 1 and Table 2) being in the first logic state (e.g., high or "1") or the CEB signal (e.g., CEB in Table 1 and Table 2) being in the second logic state (e.g., low or "0") can be configured to trigger a generation of the DCK signal.

By generating a local clock signal and a global clock signal independently, as discussed above, the techniques disclosed herein can allow for a DFT mode clock generation independent of a mission mode clock generation. This can thereby enable an independent tuning of power, performance, and area (PPA) for the DFT operation, while allowing for the PPA for the mission mode tuned without affecting the DFT operation.

FIG. 4 illustrates a flowchart of a method 400 to operate a memory system, in accordance with some embodiments. It is noted that the method 400 is merely an example and is not intended to limit the present disclosure. Accordingly, it is understood that additional, fewer, or different operations may be in the method 400 of FIG. 4, additional operations provided before, during, and after the method 400 of FIG. 4, and that some other operations may only be briefly described herein. In some embodiments, the method 400 is performed by a global control circuit (e.g., the GCTRL 105).

In a brief overview, the method 400 can start with operation 410 of receiving an input clock signal, a chip enable bar (CEB) signal, and a design for testability (DFT) enable signal. The method 400 can continue to operation 420 of generating a first enable signal to cause a first clock generator to generate a local clock signal, based on a logic high state of a first set of signals among the input clock signal, the CEB signal, and the DFT enable signal. The method 400 can continue to operation 430 of generating a second enable signal to cause a second clock generator to generate a global clock signal, based on a logic high state of a second set of signals among the input clock signal, the CEB signal, and the DFT enable signal.

At operation 410, a global control circuit (e.g., the GCTRL 105) receives an input clock signal (e.g., CLK signal via the CLK line 115), a chip enable bar signal (e.g., CEB signal via the CEB line 110), and a DFT enable signal (e.g., DFT enable signal via the DFT line 120). The DFT enable signal can include a signal for enabling operation of the circuit under a testing mode.

At operation 420, the global control circuit can generate a first enable signal (e.g., the enable signal EN 205) to cause a first clock generator (e.g., the first clock generator 171) to generate a local clock signal (e.g., the GCK signal), based on a logic high state of a first set of signals among the input clock signal, the CEB signal, and the DFT enable signal. In some embodiments, the first set of signals may be or include the input clock signal (e.g., CLK in Table 1). That is, when the input clock signal is provided with the CEB signal and the DFT enable signal being in a logic low state (e.g., "0"), an enable signal EN for the GCK signal can be provided to enable a generation of the GCK signal.

At operation 430, the global control circuit can generate a second enable signal (e.g., the enable signal EN 255) to cause a second clock generator (e.g., the second clock generator 172) to generate a global clock signal (e.g., the DCK signal), based on a logic high state of a second set of signals among the input clock signal, the CEB signal, and the DFT enable signal. In some embodiments, the second set of signals may be or include the input clock signal (e.g., CLK in Table 2), the DFT enable signal (e.g., DFT in Table 2), etc. In some embodiments, the global control circuit can generate the second enable signal to cause the second clock generator to generate the global clock signal, based on a logic low state of a third set of signals among the input clock signal, the CEB signal, and the DFT enable signal. For example, the third set of signals may be or include the CEB signal (e.g., CEB in Table 2). That is, when the input clock signal is provided with the DFT enable signal being in the logic high state (e.g., "1") and/or when the input clock signal is provided with the CEB signal being in the logic low state (e.g., "0"), an enable signal EN for the DCK signal can be provided to enable a generation of the DCK signal. In some embodiments, the first enable signal (and thus the GCK signal) and of the second enable signal (and thus the DCK signal) can be thereby independently generated. For example, in a first state (e.g., the first row of Table 1 and Table 2), both the first enable signal and the second enable signal can be generated. In a second state (e.g., the second row of Table 1 and Table 2), the second enable signal can generated, while the first enable signal is not generated. In a third state (e.g., the third row of Table 1 and Table 2), none of the first enable signal and the second enable signal is generated.

One aspect of this description relates to a memory device. The memory device includes a plurality of memory cells arranged in an array, a first clock generator connected to the plurality of memory cells and configured to generate a local clock signal to be provided to the plurality of memory cells, a second clock generator connected to an input/output interface connected to the plurality of memory cells, the second clock generator configured to generate a global clock signal to be provided to the input/output interface, and one or more logic gates connected to at least one of the first clock generator or the second clock generator, wherein the one or more logic gates allow the local clock signal and the global clock signal to be output independently.

One aspect of this description relates to a circuit. The circuit includes a first clock generator to generate a local clock signal according to an input clock signal, a chip enable bar (CEB) signal, and a design for testability (DFT) enable signal, a second clock generator to generate a global clock signal according to the input clock signal, the CEB signal, and the DFT enable signal, and one or more logic gates to independently generate the local clock signal or the global clock signal according to the input clock signal, the CEB signal, and the DFT enable signal, wherein at least one of the DFT enable signal of a logic high state or the CEB signal of a logic low state is configured to trigger a generation of the global clock signal including a signal enabling a test mode operation of the circuit.

One aspect of this description relates to a method. The method includes receiving an input clock signal, a chip enable bar (CEB) signal, and a design for testability (DFT) enable signal, generating a first enable signal to cause a first clock generator to generate a local clock signal, based on a logic high state of a first set of signals among the input clock signal, the CEB signal, and the DFT enable signal, and generating a second enable signal to cause a second clock generator to generate a global clock signal, based on a logic high state of a second set of signals among the input clock signal, the CEB signal, and the DFT enable signal, wherein generation of the first enable signal and the second enable signal are independent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of memory cells arranged in an array;
    a first clock generator connected to the plurality of memory cells and configured to generate a local clock signal to be provided to the plurality of memory cells;
    a second clock generator connected to an input/output interface connected to the plurality of memory cells, the second clock generator configured to generate a global clock signal to be provided to the input/output interface; and
    one or more logic gates connected to at least one of the first clock generator or the second clock generator such that the first clock generator and the second clock generator are to output the local clock signal and the global clock signal independently according to at least a design for testability (DFT) enable signal.

2. The memory device of claim 1, wherein the one or more logic gates perform a logic NOR operation to generate the local clock signal.

3. The memory device of claim 1, wherein the one or more logic gates perform a logic NOT operation and a logic NAND operation to generate the global clock signal.

4. The memory device of claim 1, wherein a reset of the local clock signal is triggered in response to a local clock bar signal being in a low logic state.

5. The memory device of claim 1, wherein the first clock generator generates a local tracking word line signal to discharge a bit line of tracking bit cells.

6. The memory device of claim 5, wherein a discharged bit line is to generate a reset signal to reset the local clock signal.

7. The memory device of claim 6, wherein the reset signal is to determine a pulse width of the local clock signal.

8. The memory device of claim 1, wherein the second clock generator generates a global tracking word line signal to access the input/output interface, and wherein after accessing the input/output interface, the global tracking word line signal is to generate a reset signal to reset the global clock signal.

9. The memory device of claim 8, wherein the reset signal is to determine a pulse width of the global clock signal.

10. The memory device of claim 1, wherein the one or more logic gates are configured to:

cause, in a first state, the first clock generator and the second clock generator to activate the local clock signal and the global clock signal, respectively;

cause, in a second state, the second clock generator to activate the global clock signal; and prevent, in a third state, the first clock generator and the second clock generator from activating the local clock signal and the global clock signal, respectively.

11. A circuit, comprising:

a first clock generator configured to generate a local clock signal according to an input clock signal, a chip enable bar (CEB) signal, and a design for testability (DFT) enable signal;

a second clock generator configured to generate a global clock signal according to the input clock signal, the CEB signal, and the DFT enable signal; and one or more logic gates configured to cause the first clock generator and the second clock generator to independently generate the local clock signal and the global clock signal according to the input clock signal, the CEB signal, and the DFT enable signal, wherein at least one of the DFT enable signal of a logic high state or the CEB signal of a logic low state is configured to trigger an activation of the global clock signal including a signal enabling a test mode operation of the circuit.

12. The circuit of claim 11, wherein the one or more logic gates perform a logic NOR operation on the DFT enable signal and the CEB signal to generate the local clock signal.

13. The circuit of claim 11, wherein the one or more logic gates perform a logic NOT operation on the DFT enable signal and a logic NAND operation on a result of the logic NOT operation and the CEB signal to generate the global clock signal.

14. The circuit of claim 11, wherein the first clock generator generates a local tracking word line signal to discharge a bit line of tracking bit cells.

15. The circuit of claim 14, wherein a discharged bit line is to generate a reset signal to reset the local clock signal.

16. The circuit of claim 15, wherein the reset signal is to determine a pulse width of the local clock signal.

17. The circuit of claim 11, wherein the second clock generator generates a global tracking word line signal to access an input/output interface, and wherein after accessing the input/output interface, the global tracking word line signal is to generate a reset signal to reset the global clock signal.

18. The circuit of claim 11, wherein:

in a first state, in which the DFT enable signal is in a logic low state and the CEB signal is in the logic low state, the first clock generator and the second clock generator generate the local clock signal and the global clock signal, respectively;

in a second state, in which the DFT enable signal is in the logic high state and the CEB signal is in the logic low state, the second clock generator generates the global clock signal; and in a third state, in which the DFT enable signal is in the logic low state and the CEB signal is in a logic high state, the first clock generator and the second clock generator are prevented from generating the local clock signal and the global clock signal, respectively.

19. A method, comprising:

receiving an input clock signal, a chip enable bar (CEB) signal, and a design for testability (DFT) enable signal;

generating a first enable signal to cause a first clock generator to activate a local clock signal, based on a logic high state of a first set of signals among the input clock signal, the CEB signal, and the DFT enable signal; and generating a second enable signal to cause a second clock generator to activate a global clock signal, based on a logic high state of a second set of signals among the input clock signal, the CEB signal, and the DFT enable signal, wherein generation of the first enable signal and the second enable signal are independent.

20. The method of claim 19, wherein:

in a first state, both the first enable signal and the second enable signal are activated;

in a second state, the second enable signal is activated, and the first enable signal is not activated; and in a third state, the first enable signal is not activated, and the second enable signal is not activated.

* * * * *